(12) United States Patent
Te Kolste et al.

(10) Patent No.: US 6,314,223 B1
(45) Date of Patent: Nov. 6, 2001

(54) DIFFRACTIVE VERTICAL CAVITY SURFACE EMITTING LASER POWER MONITOR AND SYSTEM

(75) Inventors: Robert Te Kolste; Alan D. Kathman; Erik G. Johnson; Michael R. Feldman, all of Charlotte, NC (US)

(73) Assignee: Digital Optics Corporation, Charlotte, NC (US)

( * ) Notice: Subject to any disclaimer, the term of this patent is extended or adjusted under 35 U.S.C. 154(b) by 0 days.

(21) Appl. No.: 09/386,280

(22) Filed: Aug. 31, 1999

Related U.S. Application Data

(60) Provisional application No. 60/097,830, filed on Aug. 31, 1998.

(51) Int. Cl.⁷ ........................................ G02B 6/76
(52) U.S. Cl. ............................................ 385/48
(58) Field of Search ........................ 385/48; 356/222, 356/218; 250/208.1, 208.2; 368/66

(56) References Cited

U.S. PATENT DOCUMENTS

| 4,842,404 | * | 6/1989 | Duda | 356/218 |
| 5,191,204 | * | 3/1993 | Dickson et al. | 250/208.2 |
| 5,247,167 | * | 9/1993 | Bargerhuff et al. | 250/208.1 |
| 5,661,737 | * | 8/1997 | Hecht et al. | 372/23 |
| 5,696,862 | | 12/1997 | Hauer et al. | 385/88 |
| 5,809,050 | | 9/1998 | Baldwin et al. | 372/43 |
| 5,812,581 | * | 9/1998 | Cox | 372/50 |
| 5,832,156 | | 11/1998 | Strasser et al. | 385/48 |
| 5,939,773 | | 8/1999 | Jiang et al. | 257/666 |
| 5,997,185 | | 12/1999 | Kropp | 385/89 |
| 6,037,644 | | 3/2000 | Daghighian et al. | 257/444 |
| 6,072,607 | * | 6/2000 | Tajiri et al. | 359/15 |

* cited by examiner

*Primary Examiner*—Ricky Mack
(74) *Attorney, Agent, or Firm*—Susan S. Morse

(57) ABSTRACT

A power monitor for a light emitter emitting from a single face creates a monitor beam by deflecting a portion of the application beam and further manipulating the monitor beam to allow more efficient use of the monitor beam. For example, the monitor beam may be collimated to allow an increase in spacing between the light emitter and a detector for sensing the monitor beam. Alternatively or additionally, the monitor beam may be focused to allow use of a smaller detector and of a smaller percentage of the application beam. The diffractive element deflecting the beam may be either transmissive or reflective. The additionally manipulation of the monitor beam may be provided by the same diffractive element which deflects the beam, which is particularly useful when the diffractive element is reflective, and/or by additional optical elements.

17 Claims, 3 Drawing Sheets

DIFFRACTIVE VERTICAL CAVITY SURFACE EMITTING LASER POWER MONITOR AND SYSTEM

CROSS-REFERENCE TO RELATED APPLICATIONS

The present application claims priority under 35 U.S.C. §119 to U.S. Provisional Application No. 60/097,830 filed on Aug. 31, 1998, the entire contents of which are hereby incorporated by reference for all purposes.

BACKGROUND OF THE INVENTION

1. Field of the Invention

The present invention is directed to monitoring power of a light emitting device, specifically for a diffractive power monitor for use with vertical cavity surface emitting lasers (VCSELs).

2. Description of Related Art

Light emitting devices such as VCSELs need some form of power control to maintain a constant output. Such control is typically automatically performed by measuring an output of a light emitting device during operation and using this measurement to control the power supplied to the light emitting device.

Such control may be easily achieved when the light emitting device to be controlled is an edge emitting laser because edge emitting lasers output light from two ends thereof. Thus, one output may be used for the desired application, while the other output may be used for the power control.

In contrast, a VCSEL typically only emits light from one surface. Hence, any monitoring of the light must be from the same output as used for the desired application of the VCSEL. VCSELs are much cheaper and their surface emissions make them easier to integrate with other optical devices than the edge emitting lasers, so the use of VCSELs is very desirable.

Previous attempts to monitor the power of VCSELS typically involve splitting off of a portion of the output beam to use as a monitor beam. Examples of such configurations are disclosed in U.S. Pat. Nos. 5,757,836 and 5,774,486. However, such splitting off obscures part of the beam which may affect the wavefront and imaging, and hence coupling, of the light. Further, if the intensity distribution changes, such as when there is a change in lasing mode, the monitored power may change in a way which does not represent the overall output power of the VCSEL.

Additionally, splitting off of the beam may require the output of the VCSEL to be increased in order to maintain the requisite power level while allowing detection. Previous uses of scattering the beam to create a monitor beam relied on reflection for directing the beam and did not provide an optimal signal to the monitor detector. Further, previous scattering did not insure the entire beam was being monitored.

SUMMARY OF THE INVENTION

The present invention is therefore directed to power monitoring which substantially overcomes one or more of the problems due to the limitations and disadvantages of the related art.

These and other object may be realized by monitoring power over a light beam to be used in an application. Such monitoring may be performed using a diffractive to separate a percentage of the beam to be used to form a monitor beam and detecting the power of the monitor beam.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which.

DETAILED DESCRIPTION OF THE PREFERRED EMBODIMENTS

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation.

Figure 1A:
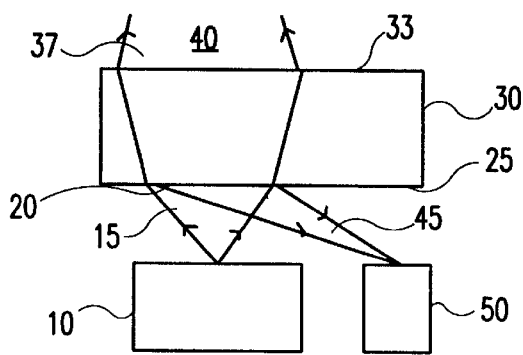
FIGS. 1a and 1b are side views of an embodiment of the present invention incorporating a reflection diffractive element for forming a monitor beam.

A configuration for monitoring power of an entire beam is shown in FIG. 1a. A light emitting device 10, e.g., a VCSEL or a light emitting diode, emits a light beam 15 to be used in a desired application. The light beam 15 impinges upon a diffractive element 20, preferably on a first surface 25 of a substrate 30. The diffractive element 20 is preferably a shallow diffractive structure, i.e., having phase depths of less than $2\pi$, the depth of which is determined by the wavelength of the light emitting device 10 and the desired efficiency of the diffractive element. Use of a shallow diffractive structure reduces the amount of light diffracted into the first order, i.e., into the monitor beam. Alternatively, this same effect may be realized may varying the width of the step heights so they are not equal to one another.

The diffractive element 20 transmits a majority of the beam into the zeroth or undiffracted order to form an application beam 40, while typically transferring a small percentage into other orders, including a reflective order. In some embodiments, up to 50% of the light may be deflected into higher orders to form the monitor beam. Light transferred into the reflective order is across the entire light beam and forms a monitor beam 45. Since angles associated with a reflective order to be monitored, typically the first reflected order, are known, an appropriately positioned monitor 50, e.g., a photodetector, measures the power of the monitor beam 45 and the measured power is then used to control the operation of the light emitting device 10 in a known manner. A surface 35 opposite the diffractive element may include additional optical elements 37, either diffractive, refractive or hybrid, for performing further optical functions on the application beam 40, such as collimating, focusing, and/or coupling the light into a fiber.

As an illustrative example, if the light 15 has a wavelength of 830 nm, a diffractive element having an eight level blazed grating made in fused silica was designed to have a total structure depth of approximately 2300 Å. This depth was chosen so that approximately 90% of the light is transmitted into the zeroth order to form the application beam 40, approximately 2% of the light is reflected into the first reflected order to form the monitor beam 45, approximately 1.4% of the light is transmitted into the first transmission order, with the remainder of the light being transferred to higher orders in decreasing percentages.

Figure 1B:
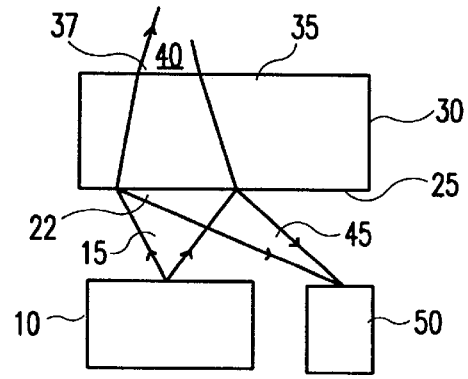

In both FIGS. 1a and 1b, the diffractive element 20 also focuses the monitor beam onto the detector 50. The focusing of the monitor beam avoids VCSEL feedback encountered when a grating is used to simply scatter the light. Further, the focusing allows the detector to be smaller. In general, it is preferable that the diffractive optical element used in the present invention provides optical functioning, e.g., collimation, focusing, to the monitor beam, particularly when the diffractive optical element reflects the monitor beam so no other additional surfaces are available on which to provide an optical element for further optical functioning to the monitor beam. Such a diffractive element is preferably a computer generated hologram.

As shown in FIG. 1b, additionally or alternatively, a transmission diffractive element for performing at least one of the further optical functions on the application beam 40 may be incorporated with the reflective diffractive element 20 to form a combined diffractive 22. As can be seen in FIG. 1b, the application beam 40 is converging after leaving the first surface 25 of the substrate 30. The incorporation may be achieved by multiplexing the transmission hologram for forming the transmission diffractive element with the reflective hologram for forming the reflective diffractive element, discussed below.

For a transmission hologram, the physical step height d needed to get a phase depth of phi ($\phi$)) is:

$$d=\lambda*\phi/\{2\pi*(n-1)\}$$

where n is the refractive index.

For a reflection hologram, the physical step height d needed to get a phase depth of phi ($\phi$) is:

$$d=\lambda*\phi/(2*2\pi)$$

To get a phase depth of $2\pi$, the etch depth is $\lambda/(n-1)$ for a transmission hologram and $\lambda/2$ for a reflection hologram. Thus, depending on the refractive index of the material, the reflection hologram may be much shallower than the transmission hologram for the same phase depth. When combining these two types of holograms, the transmittance functions for the reflection hologram and transmission hologram are multiplied, i.e., their phase functions are added together. However, the phase values for the two types of holograms are encoded differently in accordance with the above equations. For example, if the index n=1.5, then a phase depth of $2\pi$ for the transmission hologram is $2\lambda$, four times greater than the $\lambda/2$ for the reflection hologram. If sixteen levels are used to encode the transmission hologram, then the four shallowest levels will correspond to 0, $\pi/2$, $\lambda$ and $3\pi/2$ for the reflection hologram.

When the phase functions are added for sufficiently low index materials, the reflection hologram function will only be a small modulation on the transmission hologram function, since the depth of the reflection hologram is much shallower, so there is not a large effect of one function degrading the other. Indeed, when using a plurality of levels, often the shallower levels needed for the transmission hologram correspond to many of the levels needed for the reflection hologram. Of course, if needed, either one or both of the hologram could incorporate levels having phase depths in excess of $2\pi$.

Figure 2:
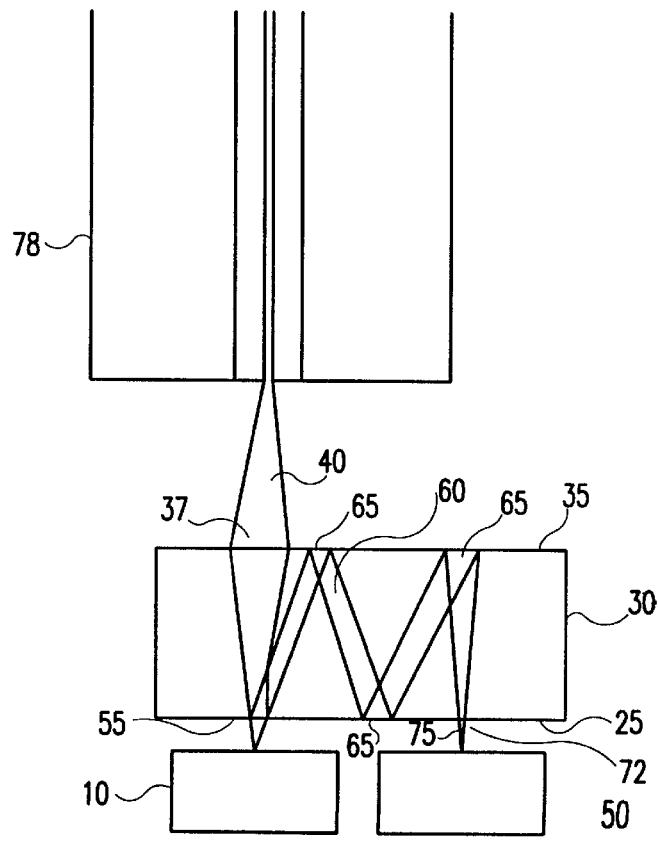
FIG. 2 is a side view of another embodiment of the present invention incorporating a collimating transmission diffractive element for forming a monitor beam.

An embodiment employing a transmission hologram for forming the monitor beam is shown in FIG. 2. The light emitting device 10 again outputs a beam of light which is incident on a substrate 30 having a first surface 25 and a second surface 35. The diffractive element 55 on the first surface deflects some light 60 off to the side. As can be seen in FIG. 2, the diffractive element 55 also collimates the monitor beam. This additional optical functioning may be realized by simply adding the two transmission functions together. Such collimation insures more light will be delivered to the detector 50 and allows greater separation between the VCSEL and detector, since the monitor beam is no longer expanding.

The deflected light 60 is then reflected off of the second surface by total internal reflection if the deflection angle is sufficiently steep, i.e., exceeds the critical angle at the second surface interface, or by an appropriately placed reflector on the second surface, such as a patch of metal 65. The reflected beam 70 then returns to the first surface, where it is incident on another transmission hologram 72 which focuses the monitor beam 75 onto the detector 50.

Again, the second surface may include optical elements for performing further optical functioning on the application beam 40. In the example shown in FIG. 2, the further optical element 37 on the second surface 35 of the substrate 30 focuses the application beam 40 in order to couple the light into an optical fiber 78.

The another transmission hologram 72 for focusing the deflected light onto the detector may be omitted if the diffractive element 55 is designed to provide focus to the deflected light beam. Such a design would eliminate the additional loss incurred if the light passes through another diffractive optical element having power. Further, as shown in FIG. 2, the deflected light may be reflected a plurality of times if the angle is appropriate or if reflectors 65 are provided on the first surface of the substrate. This increases flexibility regarding placement of the detector. Further, as discussed above in conjunction with the reflection diffractive, additional optical elements may be incorporated with the transmission diffractive to provide further optical functioning on the application beam 40, either on the first surface or the second surface of the substrate 30.

Figure 3A:
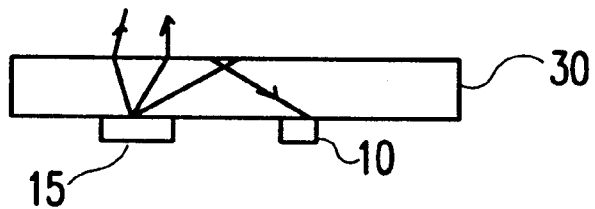
FIGS. 3a and 3b are side view of systems incorporating the power monitor of the present invention.
Figure 3B:
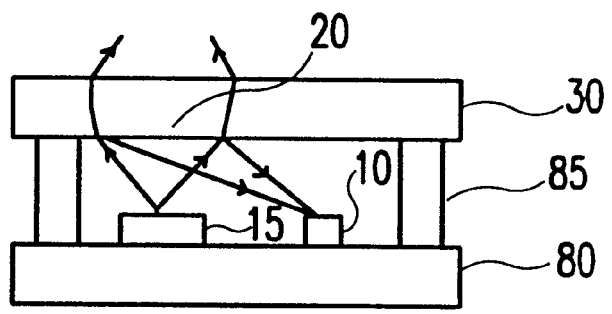

The entire system may be integrated as shown, for example, in FIGS. 3a and 3b. When the light emitting device is directly attached to a glass substrate as shown in FIG. 3a, the configuration shown in FIG. 2 is preferred. In FIG. 3b, the light emitting device is attached to a second substrate 80 which is separated from the substrate by spacer blocks 85, resulting in sufficient room to use either power monitor configuration. For either of these configurations, the integration may occur on a wafer level.

Figure 4:
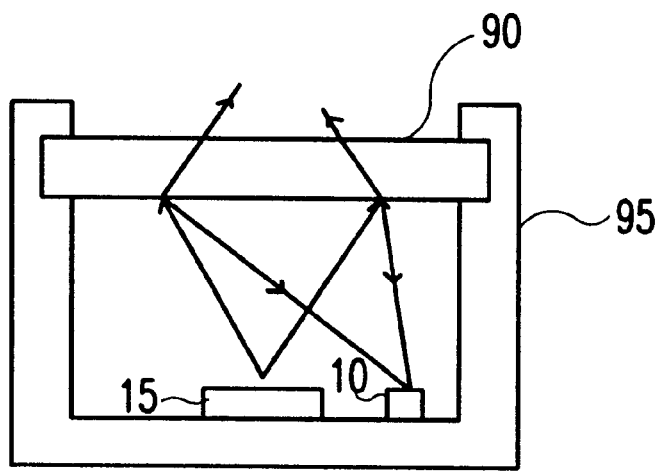
FIG. 4 is a side view of an embodiment of the present invention incorporated with a can housing the light emitting device.

As an alternative to the use of substrates, the reflection diffractive element may be incorporated into a plastic or glass cap 90 which may go inside a can 95 housing the light emitting device as shown in FIG. 4. The cap forms a protective, potentially hermetic, seal for the light emitting device. The cap 85 may be made in many ways, including injection molding.

Figure 5:
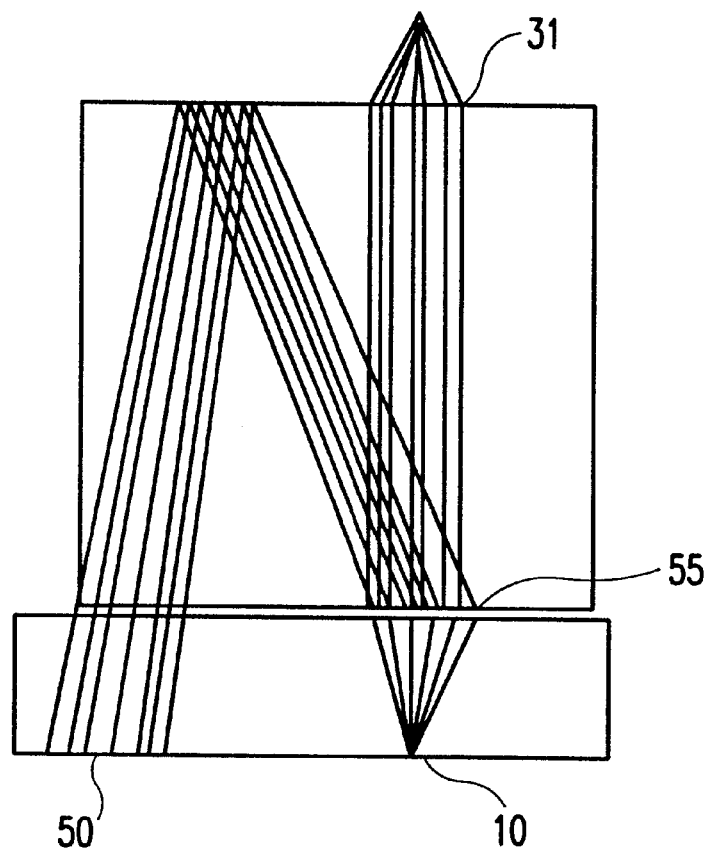
FIG. 5 is a side view of another embodiment of the present invention incorporating a collimating transmission diffractive element for forming a monitor beam.

Another configuration is shown in FIG. 5. A shown therein, light from the VCSEL 15 impinges upon a diffractive element which both splits off a portion of the beam to form a monitor beam and collimates both the monitor beam and the application beam. Such collimation allows increased flexibility in placement of the detector 10, since the monitor beam is no longer expanding. Additionally, the diffractive element 55 may also be used to focus the monitor beam on the detector 50. Alternatively, a refractive element may be provided on a surface adjacent the diffractive element 55 to provide the focusing. When placed near each other, i.e., the elements are close enough that the deflection created by the diffractive element still allows the beam to be focused by the focusing element, the relative order of the diffractive element and the focusing element doesn't matter. Preferably, the two substrates used in FIG. 5 are created and bonded together on a wafer level and them diced in order to form the optical system for both the monitor beam and the main or application beam shown therein.

Figure 6:
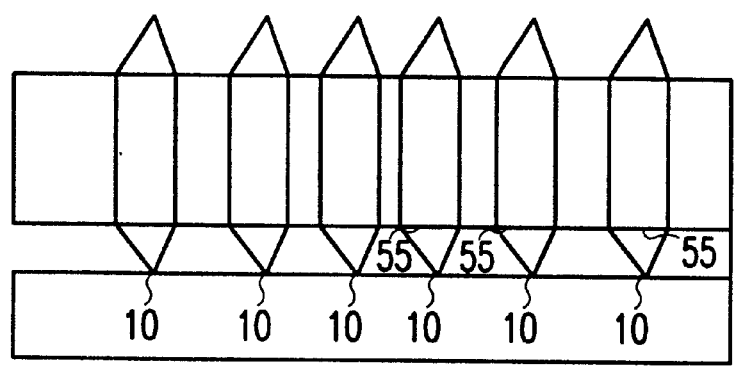
FIG. 6 is a side view of a power monitor of the present invention in conjunction with an array of light emitting devices.

An example of a configuration for monitoring an array of VCSELs is shown in FIG. 6. A monitor detector is provided for at least one of the VCSELs. The at least one detector, typically a corresponding array of detectors, is positioned in the plane of the drawing and a front view of each VCSEL 10 with a corresponding detector 55 would look like FIG. 5. Again, the monitor beam may be collimated and/or focused by the diffractive element. This collimation and/or focusing is particularly important when monitoring more than one beam of the array in order to insure the monitor beams do not influence one another.

Another alternative to the use of substrates, when the light is to be coupled to a fiber, includes incorporating the diffractive element for forming the monitor beam in a rod attached to the fiber.

While typically the entire beam is to be used, if only part of the beam is used, the diffractive element may create the monitor beam only from the portion of the beam to be used in the application. For example, if coupling the light to a fiber, only the portion of the beam which will be delivered to the core region of the fiber may be monitored.

Although preferred embodiments of the present invention have been described in detail herein above, it should be clearly understood that many variations and/or modifications of the basic inventive concepts taught herein, which may appear to those skilled in the art, will still fall within the spirit and scope of the present invention as defined in the appended claims and their equivalents.

What is claimed is:

1. A power monitor for monitoring power of a light emitting device outputting a light beam, the power monitor comprising:
   an optical system comprising at least two surfaces, said optical system supplying a functional light beam to an application;
   a diffractive optical element on one of said at least two surfaces splitting off a percentage of the light beam to create a monitor beam;
   another optical element on one of said at least two surfaces which performs further optical functioning on the monitor beam; and
   a detector for measuring power of the monitor beam.

2. The power monitor of claim 1, wherein said optical system further comprises performing at least one optical function to the functional light beam.

3. The power monitor of claim 2, wherein said at least one optical function comprises focusing said functional beam into a fiber.

4. The power monitor of claim 1, wherein the diffractive optical element is a transmission diffractive deflecting a percentage of the light beam to form a deflected beam.

5. The power monitor of claim 1, wherein said another optical element comprising a focusing optical element focusing the monitor beam onto the detector.

6. The power monitor of claim 4, wherein said another optical element comprises metal on a surface opposite the transmission diffractive element, said metal reflecting the monitor beam.

7. The power monitor of claim 1, wherein the light emitting device is a VCSEL array and said diffractive optical element and said detector are provided for at least one VCSEL in the VCSEL array.

8. The power monitor of claim 1, wherein all elements of said optical system are integrated onto a single substrate.

9. The power monitor of claim 1, wherein said another optical element comprises a reflector reflecting the monitor beam.

10. The power monitor of claim 1, wherein said another optical element comprises an optical element performing on both the functional light beam and the monitor beam.

11. A power monitoring system comprising:
    a light emitting device outputting a light beam;
    an optical system comprising at least two surfaces, said optical system supplying a functional light beam to an application;
    a diffractive optical element on one of said at least two surfaces splitting off a percentage of the light beam to create a monitor beam;
    another optical element on one of said at least two surfaces which performs further optical functioning on the monitor beam; and
    a detector for measuring power of the monitor beam.

12. The power monitoring system of claim 11, wherein the diffractive optical element is a reflective diffractive reflecting a percentage of the light beam to the detector.

13. The power monitoring system of claim 11, wherein the diffractive optical element is a transmission diffractive deflecting a percentage of the light beam to form a deflected beam.

14. The power monitoring system of claim 13, wherein said another optical element comprises metal on a surface opposite the transmission diffractive element, said metal reflecting the monitor beam.

15. The power monitoring system of claim 11, wherein said another optical element focuses the monitor beam onto the detector.

16. The power monitoring system of claim 11, wherein said another optical element comprises a reflector reflecting the monitor beam.

17. The power monitoring system of claim 11, wherein said another optical element comprises an optical element performing on both the functional light beam and the monitor beam.

* * * * *